US012638547B2

(12) United States Patent
Liu et al.

(10) Patent No.: US 12,638,547 B2
(45) Date of Patent: May 26, 2026

(54) CALIBRATION CIRCUIT AND METHOD, PHASE-SHIFT CIRCUIT, RADIO-FREQUENCY TRANSCEIVER CIRCUIT, RADAR AND DEVICE

(71) Applicant: CALTERAH SEMICONDUCTOR TECHNOLOGY (SHANGHAI) CO., LTD., Shanghai (CN)

(72) Inventors: Zhengdong Liu, Shanghai (CN); Wenting Zhou, Shanghai (CN)

(73) Assignee: Calterah Semiconductor Technology (Shanghai) Co., Ltd., Shanghai (CN)

( * ) Notice: Subject to any disclaimer, the term of this patent is extended or adjusted under 35 U.S.C. 154(b) by 280 days.

(21) Appl. No.: 18/431,677

(22) Filed: Feb. 2, 2024

(65) Prior Publication Data

US 2024/0175980 A1 May 30, 2024

Related U.S. Application Data

(63) Continuation of application No. PCT/CN2023/117835, filed on Sep. 8, 2023.

(30) Foreign Application Priority Data

Sep. 8, 2022 (CN) .......................... 202211100529.1

(51) Int. Cl.
*G01S 7/40* (2006.01)
*G01S 7/03* (2006.01)
(Continued)

(52) U.S. Cl.
CPC ............ *G01S 7/4004* (2013.01); *G01S 7/032* (2013.01); *G01S 13/288* (2013.01); *H03C 3/406* (2013.01)

(58) Field of Classification Search
CPC ...... G01S 7/4004; G01S 7/032; G01S 13/288; G01S 7/35; G01S 7/352; G01S 7/4008;
(Continued)

(56) References Cited

U.S. PATENT DOCUMENTS

| | | | |
|---|---|---|---|
| 2011/0043266 A1 | 2/2011 | Wan et al. | |
| 2015/0009064 A1* | 1/2015 | Waldschmidt | ............ G01S 7/02 |
| | | | 342/175 |

(Continued)

FOREIGN PATENT DOCUMENTS

| | | |
|---|---|---|
| CN | 106663871 A | 5/2017 |
| CN | 207318707 U | 5/2018 |

(Continued)

OTHER PUBLICATIONS

EP Search Report for EP Application No. 23847858.0, dated Nov. 29, 2024, pp. 1-8.

(Continued)

*Primary Examiner* — Curtis A Kuntz
(74) *Attorney, Agent, or Firm* — Foley & Lardner LLP

(57) ABSTRACT

A calibration circuit and a calibration method for a phase shifter, a phase-shift circuit, a radio frequency transmitting circuit, a radio frequency receiving circuit, a radar sensor and an electronic device are provided. The calibration circuit for the phase shifter includes a phase acquisition circuit and a phase calibration circuit, the phase acquisition circuit coupled to the phase shifter is configured to modulate a radio frequency sample signal acquired from the phase shifter using a first baseband signal, down-convert the modulation signal to obtain a second baseband signal containing an actual phase; the phase calibration circuit coupled to the phase acquisition circuit is configured to acquire the actual phase in the second baseband signal, determine calibration phase information according to a phase deviation between
(Continued)

the actual phase and a preset phase-shift phase, generate a phase-shift control signal according to calibration phase information and transmit it to the phase shifter.

20 Claims, 8 Drawing Sheets

(51) Int. Cl.
  *G01S 13/28* (2006.01)
  *H03C 3/40* (2006.01)

(58) Field of Classification Search
  CPC ........ G01S 7/4021; G01S 7/282; G01S 7/285; H03C 3/406; H03H 11/16
  See application file for complete search history.

(56) References Cited

U.S. PATENT DOCUMENTS

| | | | |
|---|---|---|---|
| 2017/0307669 A1 * | 10/2017 | Forstner ................. | G01R 27/28 |
| 2020/0028722 A1 | 1/2020 | Chandrashekar et al. | |
| 2020/0174098 A1 * | 6/2020 | Lang ..................... | G01S 7/4008 |
| 2020/0341112 A1 | 10/2020 | Itkin et al. | |
| 2021/0156983 A1 | 5/2021 | Kraut et al. | |

FOREIGN PATENT DOCUMENTS

| | | | | | |
|---|---|---|---|---|---|
| CN | 108241096 A | * | 7/2018 | ............. | G01R 29/10 |
| CN | 110927453 A | | 3/2020 | | |
| CN | 112867936 A | | 5/2021 | | |
| CN | 108234037 B | * | 7/2021 | ............. | H04B 17/21 |
| CN | 113242046 A | | 8/2021 | | |
| CN | 114710153 A | | 7/2022 | | |
| CN | 114826206 A | * | 7/2022 | ............. | H03H 11/16 |
| CN | 114826264 A | | 7/2022 | | |
| EP | 3425797 A1 | * | 1/2019 | ............. | H03M 1/66 |
| JP | H08-237323 A | | 9/1996 | | |
| JP | H11-109021 A | | 4/1999 | | |
| WO | WO-2016/078040 A1 | | 5/2016 | | |

OTHER PUBLICATIONS

Hampson G.A., et al., "Initial Calibration and Beamforming Results from the Thousand Element Phased-Array," IEEE Antennas and Propagation Society International Symposium, Boston, MA, Jul. 8-13, 2001, pp. 610-613.

Kalyoncu Ilker et al., "A Phase-Calibration Method for Vector-Sum Phase Shifters Using a Self-Generated Lut", IEEE Transactions on Circuits and Systems I: Regular Papers, IEEE, US, vol. 66, No. 4, Apr. 1, 2019.

Canwei, X., et al., "Real-time rapid initial phase calibration method of phased array in near field," Journal of Beijing University of Aeronautics and Astronautics, Dec. 2018, vol. 44, No. 12, 16 pages.

Office Action for CN Application No. 202211100529.1, dated Mar. 28, 2026.

* cited by examiner

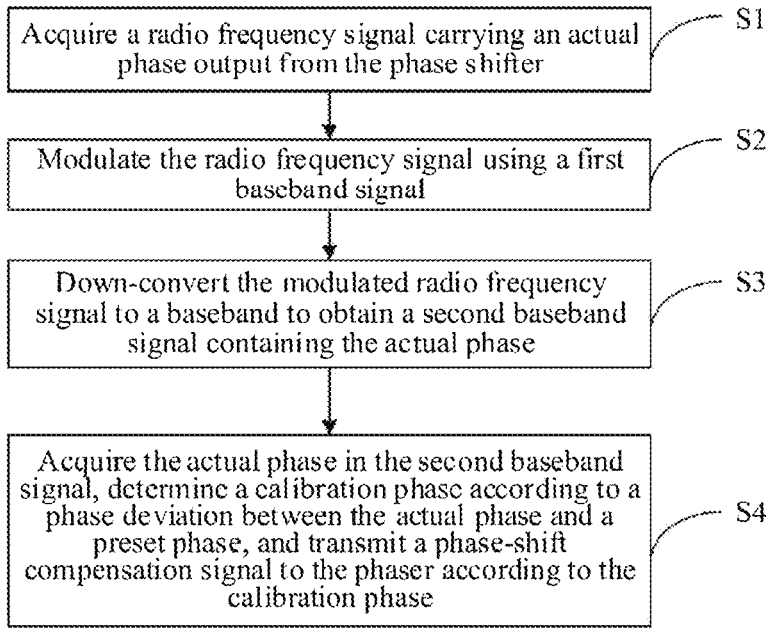

Acquire a radio frequency signal carrying an actual phase output from the phase shifter — S1

Modulate the radio frequency signal using a first baseband signal — S2

Down-convert the modulated radio frequency signal to a baseband to obtain a second baseband signal containing the actual phase — S3

Acquire the actual phase in the second baseband signal, determine a calibration phase according to a phase deviation between the actual phase and a preset phase, and transmit a phase-shift compensation signal to the phaser according to the calibration phase — S4

FIG. 13

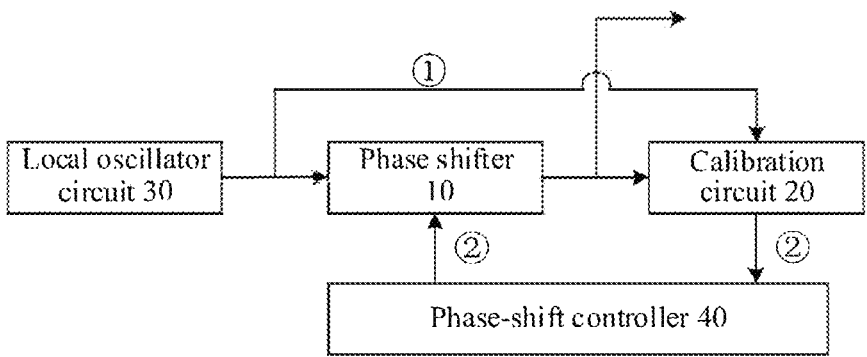

Local oscillator circuit 30

Phase shifter 10

Calibration circuit 20

①

②

②

Phase-shift controller 40

FIG. 14

CALIBRATION CIRCUIT AND METHOD, PHASE-SHIFT CIRCUIT, RADIO-FREQUENCY TRANSCEIVER CIRCUIT, RADAR AND DEVICE

CROSS-REFERENCE TO RELATED APPLICATION(S)

The present application is a continuation of International PCT Application No. PCT/CN2023/117835 filed on Sep. 8, 2023, which claims priority of Chinese Patent Application No. 202211100529.1, filed to the CNIPA on Sep. 8, 2022, the contents of which are hereby incorporated herein by reference in their entireties.

TECHNICAL FIELD

Embodiments of the present disclosure relate to, but are not limited to, the field of radio frequency technologies, in particular to a calibration circuit for a phase shifter, a calibration method for a phase shifter, a phase-shift circuit, a radio frequency transmitting circuit, a radio frequency receiving circuit, a radar sensor and an electronic device.

BACKGROUND

Integrated circuit (IC), also known as chip, is a way to miniaturize circuits in electronics, and it is often manufactured on the surface of semiconductor wafers. The chip includes a die manufactured using a semiconductor manufacturing process and an encapsulation structure. A radio frequency chip structure usually includes a phase shifter for adjusting a phase of a wave. A radio frequency phase shifter has a function of adjusting a phase of a radio frequency signal, and is an important component of a radio frequency and microwave transceiver system.

However, the calibration for the phase shifter usually needs an additional network analyzer or another instrument and complex test means, which is costly in measurement and limited by the environment.

SUMMARY

The following is a summary of subject matters described in the present disclosure in detail. This summary is not intended to limit the scope of protection of the claims.

Embodiments of the present disclosure provide a calibration circuit for a phase shifter, a calibration method for a phase shifter, a phase-shift circuit, a radio frequency transmitting circuit, a radio frequency receiving circuit, a radar sensor and an electronic device, which achieves the precise calibration of the phase shifter without relying on a measuring instrument.

In one aspect, embodiments of the present disclosure provide a calibration circuit for a phase shifter, including a phase acquisition circuit and a phase calibration circuit. The phase acquisition circuit is coupled to the phase shifter, is configured to modulate a radio frequency sample signal acquired from the phase shifter using a first baseband signal and output a second baseband signal containing an actual phase; and the actual phase is a phase of a radio frequency signal output by the phase shifter. The phase calibration circuit is coupled to the phase acquisition circuit to receive the second baseband signal, and is configured to acquire the actual phase in the second baseband signal, determine calibration phase information according to a phase deviation between the actual phase and a preset phase-shift phase and store the calibration phase information, and generate a phase-shift control signal according to the calibration phase information, and transmit the phase-shift control signal to the phase shifter.

In another aspect, embodiments of the present disclosure further provide a phase-shift circuit including a phase-shift controller, a phase shifter, and the calibration circuit as described in the first aspect. The calibration circuit is coupled to the phase shifter and is configured to transmit the phase-shift control signal to the phase shifter through the phase-shift controller in a calibration state. The phase-shift controller is coupled to the calibration circuit and the phase shifter, and is configured to receive a phase-shift instruction containing a phase-shift phase in a working state, and output the phase-shift control signal according to the stored calibration phase information corresponding to the phase-shift phase. The phase shifter is configured to perform phase-shift processing on a radio frequency signal according to the phase-shift control signal.

In another aspect, embodiments of the present disclosure further provide a radio frequency transmitting circuit including a local oscillator circuit, a phase-shift circuit as described in the above examples, and an antenna transmitting system. The local oscillator circuit outputs a generated radio frequency transmitting signal to the phase-shift circuit, the phase-shift circuit shifts a phase of the radio frequency transmitting signal and inputs the phase-shifted radio frequency transmitting signal to the antenna transmitting system, and the antenna transmitting system converts the phase-shifted radio frequency transmitting signal into an electromagnetic wave, and radiates the electromagnetic wave.

In another aspect, embodiments of the present disclosure further provide a radio frequency receiving circuit including an antenna receiving system, a phase-shift circuit as described in the above examples, a local oscillator circuit, and a frequency mixer, wherein the antenna receiving system converts an electromagnetic wave into a radio frequency receiving signal, the phase-shift circuit shifts a phase of the radio frequency receiving signal and inputs the phase-shifted radio frequency receiving signal into the frequency mixer, and the frequency mixer outputs a down-converted difference frequency signal using a local oscillator signal output by the local oscillator circuit.

In another aspect, embodiments of the present disclosure further provide a radar sensor that includes the radio frequency transmitting circuit as described in the above examples and/or the radio frequency receiving circuit as described in the above examples.

In yet another aspect, embodiments of the present disclosure further provide an electronic device that includes at least one of the phase-shift circuit as described in the above examples, the radio frequency transmitting circuit as described in the above examples, the radio frequency receiving circuit as described in the above examples, and the radar sensor as described in the above examples.

In still yet another aspect, embodiments of the present disclosure further provide a calibration method for a phase shifter, including: acquiring a radio frequency signal carrying an actual phase, wherein the radio frequency signal is output by a phase shifter; modulating the radio frequency signal using a first baseband signal; down-converting the modulated radio frequency signal to a baseband to obtain a second baseband signal containing the actual phase; and acquiring the actual phase in the second baseband signal, determining a calibration phase of the phase shifter according to a phase deviation between the actual phase and a preset phase-shift phase, and transmitting a phase-shift control signal to the phase shifter according to the calibration phase.

After the drawings and detailed description are read and understood, other aspects can be understood.

BRIEF DESCRIPTION OF THE DRAWINGS

The accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure. Shapes and sizes of various components in the drawings do not reflect actual scales, but are only intended to schematically illustrate contents of the present disclosure.

FIG. 13 is a flowchart of a calibration method for a phase shifter according to an embodiment of the present disclosure.

FIG. 14 is a schematic diagram of a structure of a phase-shift circuit according to an embodiment of the present disclosure.

DETAILED DESCRIPTION

Figure 1:
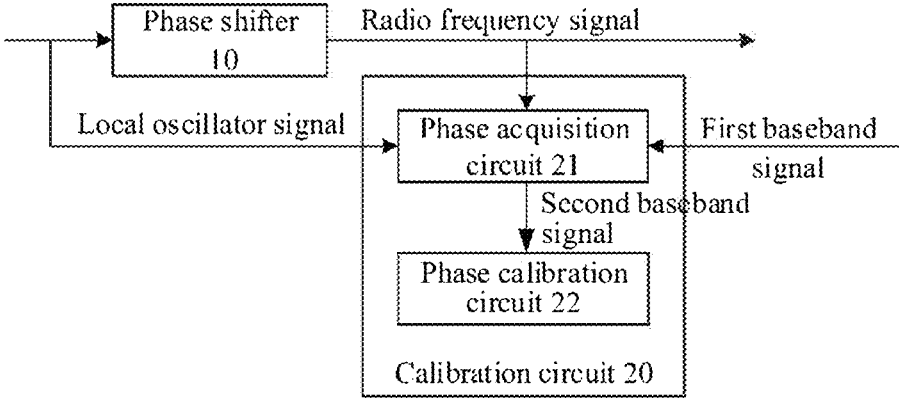
FIG. 1 is a schematic diagram of a calibration circuit according to an embodiment of the present disclosure.

Many embodiments are described herein, but the description is exemplary rather than restrictive, and to those of ordinary skills in the art, there may be more embodiments and implementation solutions within the scope of the embodiments described herein. Although many possible feature combinations are shown in the drawings and discussed in the detailed description, many other combinations of disclosed features are possible. Unless expressly limited, any feature or element of any embodiment may be used in combination with, or may replace, any other feature or element in any other embodiment.

The present disclosure includes and contemplates combinations with features and elements known to those of ordinary skill in the art. The disclosed embodiments, features and elements of the present disclosure may also be combined with any conventional features or elements to form the technical solutions defined by the claims. Any feature or element of any embodiment may also be combined with features or elements from other technical solutions to form another technical solution defined by the claims. Accordingly, it should be understood that any of the features shown and/or discussed in the present disclosure may be implemented alone or in any suitable combination. Thus the embodiments are not subject to limitations other than those made in accordance with the appended claims and their equivalent substitutions. In addition, various modifications and changes can be made within the protection scope of the appended claims.

In embodiments of the present disclosure, the terms "coupled" or "couple" may have several different meanings depending on the context in which the term is used. For example, the term "coupling" may have the meaning of mechanical coupling or electrical coupling. As used herein, the term "coupled" or "couple" may mean that two elements or devices may be connected to each other directly or connected to each other via one or more intermediate elements or devices and via an electrical element, an electrical signal, or a mechanical element (e.g., but not limited to, a wire or a cable, depending on the practical application). "Coupling" described herein includes, for example, a direct electrical connection, an inductive connection, or an opto-coupler connection, etc. For example, the electrical connection between two electrical devices is achieved using the connection mode used in semiconductor manufacturing process. For another example, the signal connection between two electrical devices is achieved using non-contact connection modes such as optocoupler components or inductance components. For another example, the connection between chip pins and slots is used to assist the electrical connection or signal connection between two electrical devices.

Taking a radar sensor as an example, a phase shifter provided in a radar sensor can not only implement phase-controlled radiation without changing the setting of a hardware circuit such as antenna, but also effectively reduce interference between radars.

In embodiments of the present disclosure, the phase shifter is a circuit for adjusting the phase of a radio frequency signal using adjustable electrical parameters of a received phase-shift control signal. The adjustable electrical parameters are, for example, the voltage, duty cycle, or current of the control signal. In some examples, the phase shifter may be a quadrature phase shifter that adaptively adjusts the phase of the radio frequency signal using changes of amplitudes of quadrature signals in a quadrature circuit and outputs the radio frequency signal carrying a phase. In still some other examples, the phase shifter may be a transmission line phase shifter that includes at least one set of phase-shift units. The phase-shift unit includes a transmission line phase-shift unit, a capacitor circuit and an adjustable circuit. The transmission line phase-shift unit includes a transmission line for transmitting a radio frequency signal, and may further include a reference ground line. The transmission line phase-shift unit adjusts the phase of the transmitted radio frequency signal by changing line spacing and/or capacitance between the transmission lines, or between the transmission line and the reference ground line. For example, the transmission line phase-shift unit includes a single-ended transmission line and two sets of reference ground lines, wherein there is a line spacing between reference ground lines of different sets of reference ground lines. As another example, the transmission line phase-shift unit includes two sets of differential transmission lines, wherein there is a line spacing between differential transmission lines of different sets of differential transmission lines. The transmission line phase-shift unit formed with the line spacing has at least two phase-shift states. A capacitor circuit is connected between the transmission lines in one of the phase-shift states so as to perform an impedance matching when the phase-shift state is switched between different phase-shift states. The adjustable circuit is configured to adjust the transmission line phase-shift unit and/or the capacitor circuit according to a control signal, so as to select one of the phase-shift states and output a radio frequency signal with the actual phase corresponding to the phase-shift state. The adjustable circuit is, for example, a circuit formed by a combination of at least one or more of an adjustable resistor circuit, an adjustable capacitor circuit and a Metal Oxide Semiconductor (MOS) transistor, and the adjustable circuit is controlled by adjustable electrical parameters of the above-described phase-shift control signal.

When the phase shifter described above works in practice, there is a phase error between an actual phase phase-shifted by the phase shifter and a preset phase-shift phase due to factors such as the design of the device, the manufacturing process, the operating temperature, and the operating electromagnetic environment; This phase error has the potential to affect the accuracy of the measured physical quantity for the radar sensor in performing subsequent signal processing. Therefore, a calibration circuit for the phase shifter is provided in the radar sensor. Precise measurement for the radio frequency phase shifter is required to determine the magnitude of the phase error before calibration is performed. By changing the setting of the radio frequency phase shifter, the error may meet the requirements. When the phase shifter receives the phase-shift control signal, the calibration circuit is adopted to compensate the phase deviation of a corresponding phase-shift phase, so as to output a radio frequency signal most close to the preset phase-shift phase in the phase-shift control signal, thus achieving the purpose of calibration. However, during this process, an additional instrument, such as a network analyzer, and complex measurement means are usually needed, which is very costly in the millimeter-wave and microwave bands. In addition, since the measurement has to need an instrument, the measurement is very much limited by the environment, and real measurement and calibration cannot be achieved while in use. It is a limitation obviously.

FIG. 1 shows a calibration circuit 20 for a phase shifter 10 according to an embodiment of the present disclosure. The calibration circuit 20 includes a phase acquisition circuit 21 and a phase calibration circuit 22. The phase acquisition circuit 21 is coupled to the phase shifter 10 and is configured to: acquire a radio frequency signal output by the phase shifter 10 to obtain a radio frequency sample signal; modulate the radio frequency sample signal acquired from the phase shifter 10 using a first baseband signal; and down-convert the obtained modulation signal to the baseband (as shown in FIG. 1, the radio frequency sample signal may be down-converted using a local oscillator signal) to obtain a second baseband signal containing an actual phase. Herein, the frequency of the second baseband signal is determined based on a frequency of the first baseband signal, and the actual phase is the phase of the radio frequency signal output by the phase shifter. The phase calibration circuit 22 is coupled to the phase acquisition circuit 21 to receive the second baseband signal, and is configured to extract the actual phase in the second baseband signal, determines and stores calibration phase information based on a phase deviation between the actual phase and a preset phase-shift phase, so that the phase calibration circuit 22 generates a phase-shift control signal based on the calibration phase information and transmits the phase-shift control signal to the phase shifter.

The first baseband signal is an intermediate frequency signal or a low frequency signal with a preset initial phase. The preset initial phase may be configured by storing it in a memory in advance (or an external instruction); the first baseband signal is synchronously transmitted to the phase calibration circuit and is detected by the phase calibration circuit. The preset initial phase of the first baseband signal is, for example, between 0° and 180° (including at least one endpoint value). The radio frequency sample signal is modulated to obtain a modulation signal, which is implemented through frequency mixing with the first baseband signal, since the radio frequency sample signal carries the actual phase, the obtained modulation signal carries the actual phase of the radio frequency sample signal.

The local oscillator signal is a radio frequency signal input to the phase shifter, which is typically a radio frequency signal having a fixed phase (e.g., a phase of 0°). After the phase shifter shifts the phase of the local oscillator signal, the radio frequency signal carrying the actual phase is output. The modulation signal is down-converted using the local oscillator signal to obtain a second baseband signal containing an actual phase. Herein, the phase of the second baseband signal is the actual phase obtained after the phase of the local oscillator signal is shifted by the phase shifter, or the sum (or difference) of the actual phase and the preset initial phase. The phase of the second baseband signal is detected using the preset phase-shift phase, the phase deviation between the obtained actual phase and the preset phase-shift phase may be determined, and calibration phase information corresponding to the preset phase-shift phase may be generated accordingly. Herein, the calibration phase information may be described as the phase deviation and a corresponding phase-shift phase; or the phase value corresponding to the preset phase-shift phase, wherein the phase value is obtained after compensation is performed by using the phase deviation; or an unit phase deviation corresponding to the unit phase-shift step calculated according to a calibration relationship between the phase deviation and the preset phase-shift phase.

When a controller in a radar sensor generates a phase-shift instruction including a phase-shift phase according to a phase control mode, a phase-shift controller (or a calibration circuit) generates a phase-shift control signal conforming to the phase-shift phase according to the calibration phase information. When the phase shifter receives the phase-shift control signal, the adjustable circuit in the phase shifter is adjusted according to the phase-shift control signal to achieve the purpose of accurate phase-shift. The phase-shift control signal is, for example, in a form of a pulse width or a voltage amplitude for describing a calibrated phase-shift phase, such that the phase offset of the radio frequency signal output by the phase shifter conforms to the phase-shift phase of the phase-shift instruction.

Figure 2:
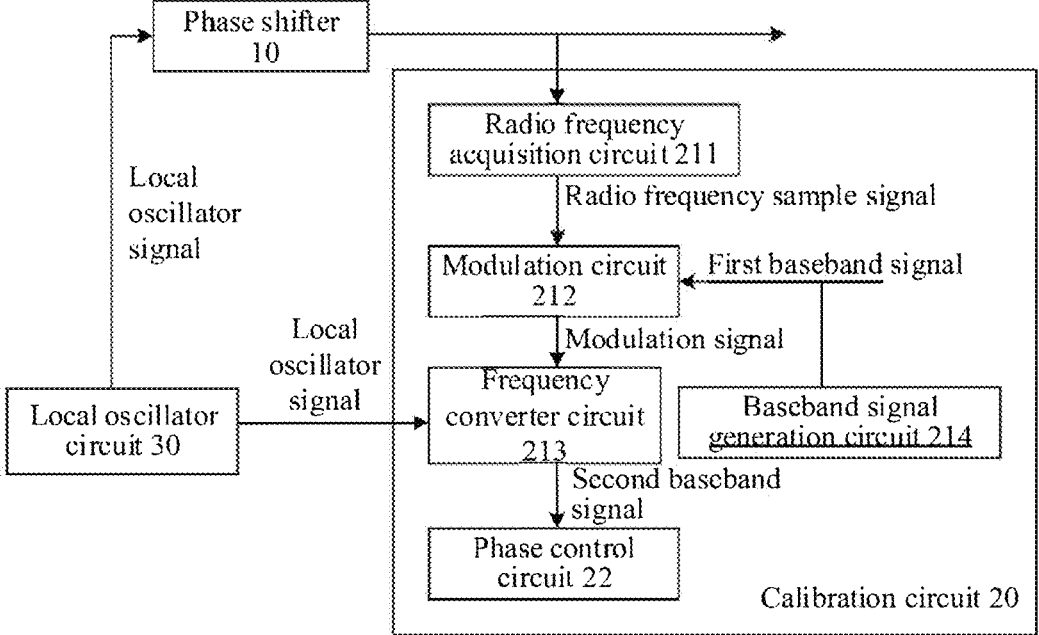
FIG. 2 is a schematic diagram of another calibration circuit according to an embodiment of the present disclosure.

In an exemplary embodiment, the phase acquisition circuit is a circuit for acquiring phase information contained in a radio frequency signal. As shown in FIG. 2, the phase acquisition circuit includes a radio frequency acquisition circuit 211, a modulation circuit 212 and a frequency converter circuit 213. The first baseband signal may be provided by an external circuit or generated by a baseband signal generation circuit 214 shown in FIG. 2. The radio frequency acquisition circuit 211 is coupled to the phase shifter 10 and is configured to acquire the radio frequency signal output by the phase shifter 10 to output the radio frequency sample signal. The modulation circuit 212 is coupled to the radio frequency acquisition circuit 211 and the baseband signal generation circuit 214 (optionally), and is configured to modulate the radio frequency sample signal using the first baseband signal to generate a modulation signal containing an actual phase. The frequency converter circuit 213 is coupled to the modulation circuit 212 and a local oscillator circuit 30 (optionally, in some other embodiments, the local oscillator signal may be provided by an external circuit), and is configured to perform down-conversion processing on the modulation signal using the local oscillator signal to generate a second baseband signal including the actual phase. The baseband signal generation circuit 214 is coupled to the modulation circuit 212 and configured to generate the first baseband signal.

In this embodiment, the modulation mode in which the radio frequency signal of which the phase is shifted by the phase shifter is mixed in frequency with the first baseband signal is adopted, so that the mixed radio frequency signal carries the phase information in the original radio frequency signal, and then the second baseband signal carrying the phase information may be obtained through down-conversion processing, i.e., subtractive frequency mixing, so as to achieve the purpose of transferring the phase information carried in the acquired radio frequency signal into a baseband signal, so as to extract the phase information from the baseband signal with a lower frequency. Here, a phase extraction approach using quadrature second baseband signals can achieve the effect of a smaller error in the extracted phase compared with a phase extraction approach using a single-ended second baseband signal.

The radio frequency acquisition circuit is a circuit for acquiring radio frequency signals. In some examples, the radio frequency acquisition circuit is electrically connected to the output of the phase shifter. For example, the radio frequency acquisition circuit includes a coupler for outputting one channel of radio frequency signal or a coupler for outputting quadrature radio frequency signals. In some other examples, the radio frequency acquisition circuit acquires radio frequency signals through inductive coupling. The radio frequency acquisition circuit includes, for example, a coupling wire and an impedance matching circuit, etc.

The modulation circuit is a circuit for modulating radio frequency sample signals. In this example, the modulation mode is, for example, analog linear modulation, and frequency modulation is achieved by modulation, for example, the first baseband signal is modulated to a radio frequency sample signal by frequency modulation processing. The modulation circuit includes, for example, a mixer, such as a quadrature mixer or a mixer (single input and single output).

The frequency converter circuit is a single-sideband mixing circuit. In this example, the radio frequency signal is modulated (e.g., down-converted) to a baseband signal (e.g., a low-band signal) by frequency conversion processing. The frequency converter circuit may be achieved by a quadrature mixer or a single-ended mixer. After down-conversion processing, the output second baseband signal is a low-band signal containing the actual phase information of the radio frequency signal, which is convenient for the phase calibration circuit to extract the phase information.

The baseband signal generation circuit is a circuit for generating a first baseband signal, which may be an external baseband circuit or integrated in a radio frequency chip together with the phase shifter and the calibration circuit. The calibration circuit is connected to the baseband signal generation circuit via an internal connection within the chip or using a wire outside the chip to receive the first baseband signal.

Figure 3:
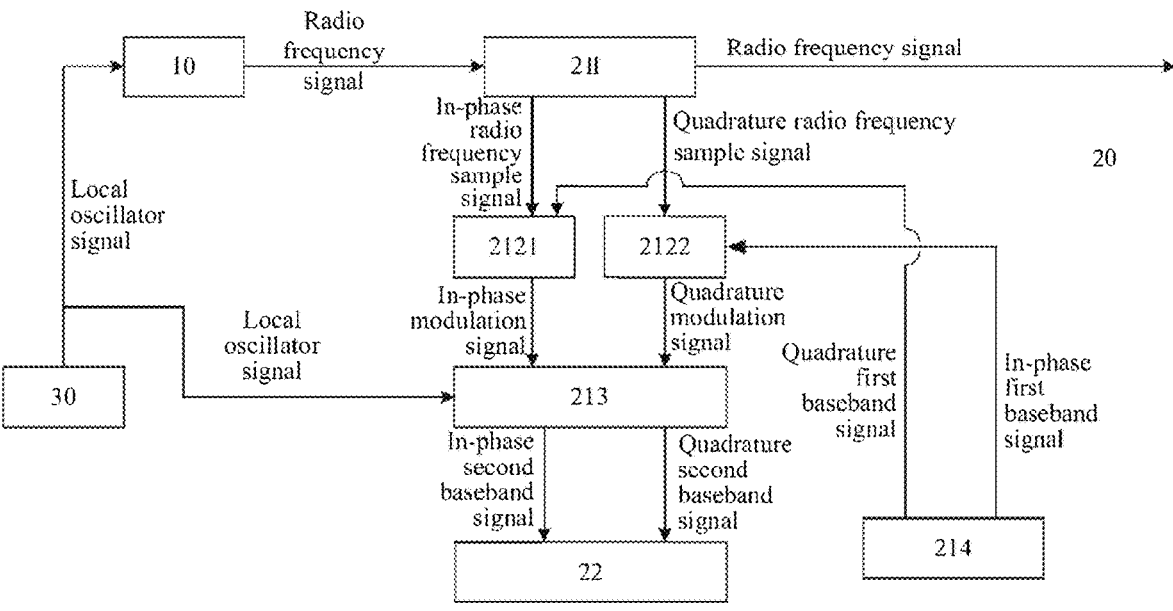
FIG. 3 is a schematic diagram of yet another calibration circuit according to an embodiment of the present disclosure.

In an exemplary embodiment, the radio frequency acquisition circuit 211 may be a first quadrature coupler including an in-phase output (or a first output) for outputting an in-phase radio frequency sample signal and a quadrature output (or a second output) for outputting a quadrature radio frequency sample signal, and accordingly, the first baseband signal is quadrature signals including an in-phase first baseband signal and a quadrature first baseband signal. The modulation circuit 212 includes two modulators, each of which is separately connected to an output of the first quadrature coupler, and the modulation signal output from the modulation circuit is also quadrature signals. The first modulator is connected with the in-phase output of the first quadrature coupler, and the second modulator is connected with the quadrature output of the first quadrature coupler. The first modulator is configured to modulate the in-phase radio frequency sample signal using the in-phase first baseband signal; the second modulator is configured to modulate the quadrature radio frequency sample signal using the quadrature first baseband signal. For example, as shown in FIG. 3, the first quadrature coupler 211 is coupled to the phase shifter 10, and is configured to acquire the radio frequency signal output from the phase shifter 10 and output differential radio frequency sample signals with a phase difference of 90 degrees, i.e., an in-phase radio frequency sample signal and a quadrature radio frequency sample signal. The modulator 2121 is a first frequency mixer for processing the in-phase signal; the modulator 2122 is a first frequency mixer for processing the quadrature signal. The baseband signal generation circuit 214 is coupled to the first frequency mixer 2121 and configured to output an in-phase first baseband signal to the first frequency mixer 2121, and the baseband signal generation circuit 214 is coupled to the first frequency mixer 2122 and configured to output a quadrature first baseband signal to the first frequency mixer 2122. The first frequency mixer 2121 modulates the in-phase radio frequency sample signal and the in-phase first baseband signal to generate an in-phase modulation signal including the actual phase, and the first frequency mixer 2122 modulates the quadrature radio frequency sample signal and the quadrature first baseband signal to generate a quadrature modulation signal including an actual quadrature phase. Herein, the phase difference between the actual quadrature phase and the actual phase is 90°.

The frequency converter circuit includes a second frequency mixer for achieving down conversion, the second frequency mixer receives a modulation signal and a local oscillator signal to perform a down conversion processing using the modulation signal and the local oscillator signal, and outputs a second baseband signal. In the example shown in FIG. 3, the frequency converter circuit 213 respectively performs down-conversion processing on the quadrature modulation signals using the local oscillator signal to obtain the quadrature second baseband signals (the second baseband signals include an in-phase second baseband signal and a quadrature second baseband signal). For example, the frequency converter circuit 213 includes two second frequency mixers (not shown) which separately performs down-conversion processing on the in-phase modulation signal and the quadrature modulation signal using the same local oscillator signal, respectively, to obtain the in-phase second baseband signal and the quadrature second baseband signal. Herein, the in-phase second baseband signal and the quadrature second baseband signal both carry the actual phase in the radio frequency sample signal, and the phase difference between the in-phase second baseband signal and the quadrature second baseband signal is 90°.

Figure 4:
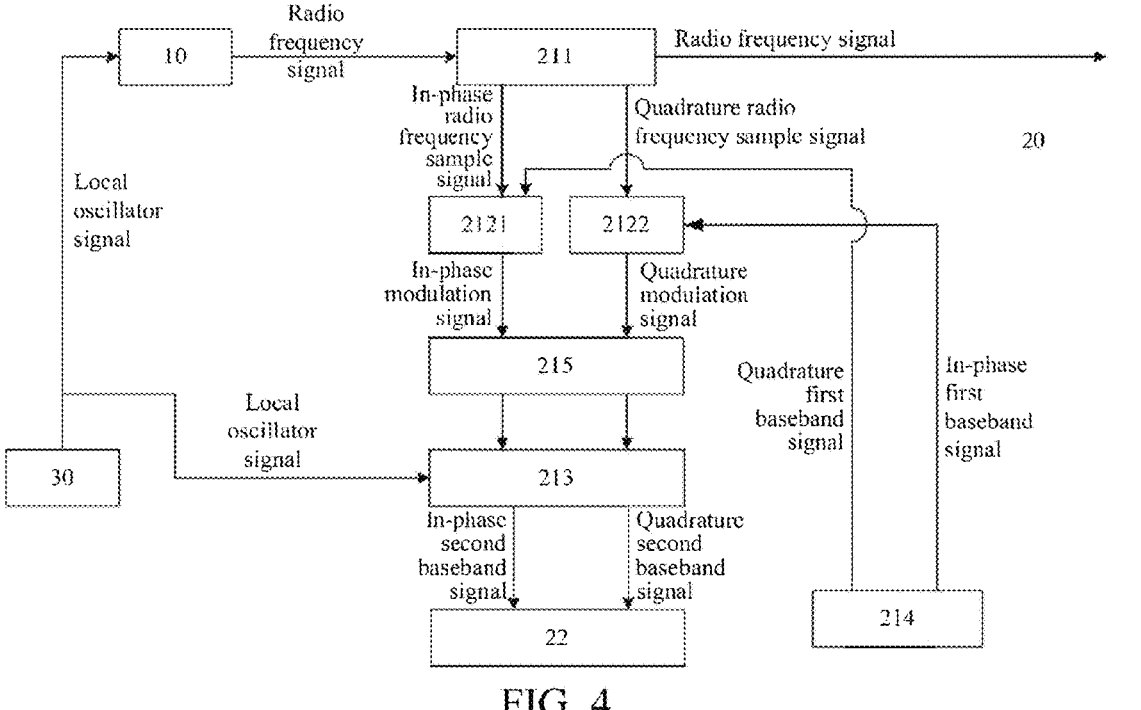
FIG. 4 is a schematic diagram of yet another calibration circuit according to an embodiment of the present disclosure.

Optionally, each signal transmission path in the phase acquisition circuit may include a first amplifier for signal amplification, for example, which may be coupled between the modulation circuit and the frequency converter circuit. For example, the first amplifier is coupled between the first frequency mixer (2121, 2122) and the frequency converter circuit 213, and is configured to amplify modulation signals (such as an in-phase modulation signal and a quadrature modulation signal) output by the modulation circuit (such as the first frequency mixer) and input them to the frequency converter circuit 213. As shown in FIG. 4, when the first amplifier 215 is included, the first amplifier 215 is located on both transmission paths for transmitting quadrature signals.

Figure 5:
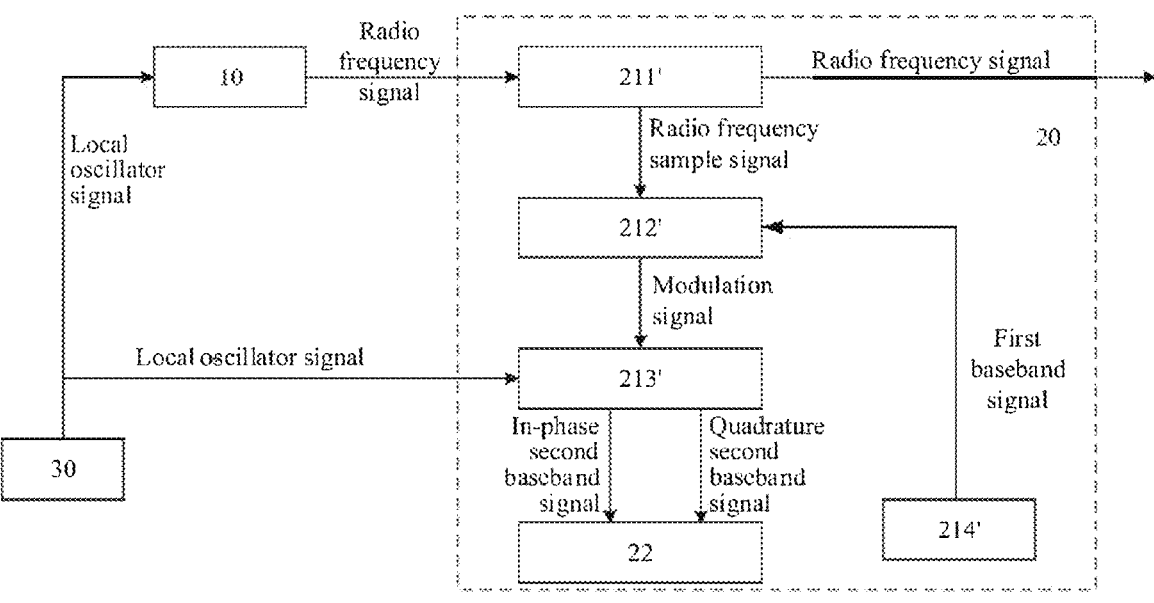
FIG. 5 is a schematic diagram of yet another calibration circuit according to an embodiment of the present disclosure.

In yet another exemplary embodiment, the radio frequency acquisition circuit includes a single-ended coupler 211', and the modulation circuit includes a single-ended third frequency mixer 212'. As shown in FIG. 5, the single-ended coupler 211' is coupled to the phase shifter 10 and configured to acquire the radio frequency signal output from the phase shifter 10, the baseband signal generation circuit 214' is coupled to the third frequency mixer 212' and configured to output a first baseband signal to the third frequency mixer 212', and the third frequency mixer 212' is coupled to the single-ended coupler 211' and the baseband signal generation circuit 214', and configured to modulate the radio frequency sample signal and the first baseband signal to generate a modulation signal including an actual phase. The modulation signal is a single-ended signal.

Figure 6:
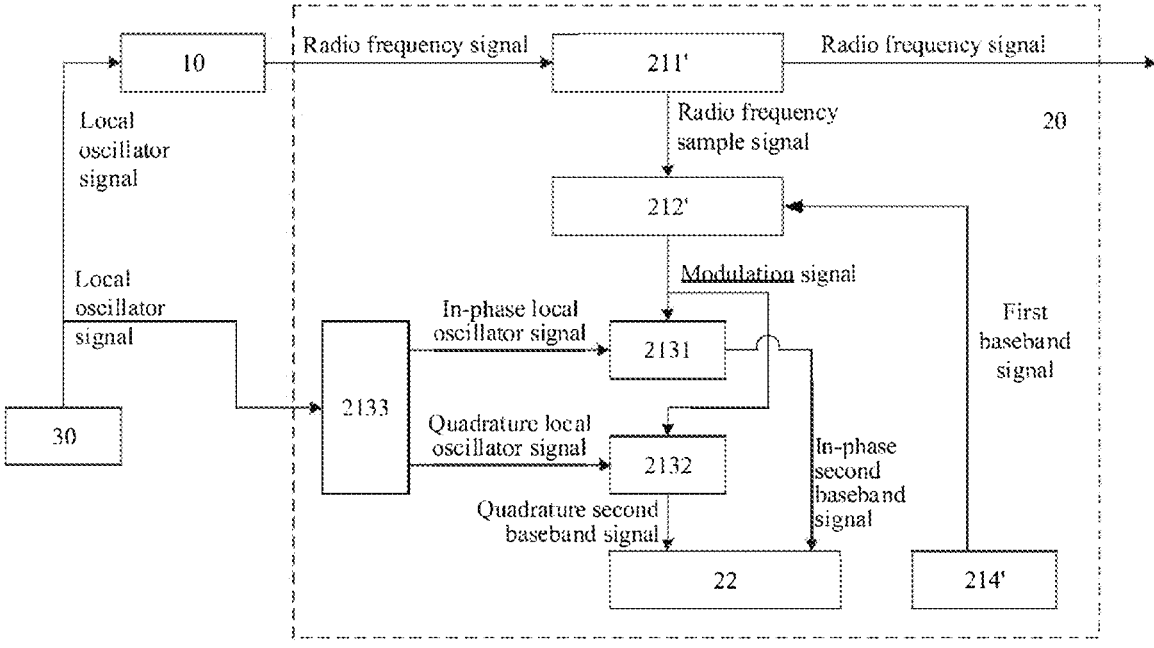
FIG. 6 is a schematic diagram of yet another calibration circuit according to an embodiment of the present disclosure.

Taking the modulation signal of a single-ended signal as an example, as shown in FIG. 6, the frequency converter circuit 213' includes a second quadrature coupler 2133 and a fourth frequency mixer (2131,2132). The second quadrature coupler 2133 is coupled to the local oscillator circuit 30 and configured to acquire the local oscillator signal output from the local oscillator circuit 30 and output an in-phase local oscillator signal and a quadrature local oscillator signal with a phase difference of 90 degrees. The second quadrature coupler 2133 includes an in-phase output for outputting an in-phase local oscillator signal and a quadrature output for outputting a quadrature local oscillator signal. The fourth frequency mixer 2131 is coupled between the in-phase output of the second quadrature coupler 2133 and the third frequency mixer 212', and is configured to perform down-conversion processing on the single-ended modulation signal output from the third frequency mixer 212' using the in-phase local oscillator signal output from the second quadrature coupler 2133 to generate the in-phase second baseband signal including the actual phase. The fourth frequency mixer 2132 is coupled between the quadrature output of the second quadrature coupler 2133 and the third frequency mixer 212', and is configured to perform down-conversion processing on the modulation signal output from the third frequency mixer 212' using the quadrature local oscillator signal output from the second quadrature coupler 2133 to generate the quadrature second baseband signal including the actual phase. Herein, the second baseband signal is a quadrature signal containing an actual phase, and the second baseband signal includes an in-phase second baseband signal and a quadrature second baseband signal.

In some other examples, the modulation circuit 212 may include a quadrature circuit (not shown) to convert a single-ended modulation signal output from the third frequency mixer 212' into quadrature signals, i.e., such that the modulation circuit outputs an in-phase modulation signal and a quadrature modulation signal. In this way, quadrature second baseband signals may be output using the frequency converter circuit in the example of FIG. 3 or 4.

Optionally, on the basis of the embodiment shown in FIG. 5 or FIG. 6, the phase acquisition circuit may further include a second amplifier (not shown). In the example shown in FIG. 5, the second amplifier may be coupled between the third frequency mixer 212' and the frequency converter circuit 213', configured to amplify and split the modulation signal output from the third frequency mixer 212' and then output it. In the example shown in FIG. 6, the second amplifier may be coupled in one transmission path between the third frequency mixer 212' and the fourth frequency mixer (2131, 2132) for transmitting a single-ended modulation signal, the second amplifier amplifies the modulation signal output from the third frequency mixer 212' and splits the modulation signal in a quadrature mode, and outputs them to the fourth frequency mixer 2131 and the fourth frequency mixer 2132 respectively.

After the second baseband signal is obtained, the actual phase carried in the second baseband signal is extracted by the phase calibration circuit, and the calibration phase information is determined and stored according to the phase deviation between the actual phase and the preset phase-shift phase, so that the phase calibration circuit generates a phase-shift control signal according to the calibration phase information, and transmits the phase-shift control signal to the phase shifter. Herein, the preset phase-shift phase is set based on the actual phase to be calibrated.

In a calibration operation, the phase calibration circuit extracts an actual phase from the second baseband signal, the actual phase is obtained by shifting the phase of the radio frequency signal by the phase shifter according to the phase-shift phase prior to the calibration. When determining the phase deviation between the preset phase-shift phase and the actual phase, the phase calibration circuit obtains the calibration phase information of the phase shifter corresponding to the phase-shift phase. Thus, the calibration phase information can enable the actual phase of the radio frequency signal output from the calibrated phase shifter in a non-calibrated state (e.g., in a working state) to be closer to the preset phase-shift phase information compared to that before the calibration. The calibration phase information, for example, is the determined phase deviation or the compensation information determined according to the phase deviation.

Here, the compensation information is determined according to the type of the phase shifter and/or the calibration strategy, etc. The calibration strategy is set based on multiple tests of the phase shifter. The factors considered by the calibration strategy include, but are not limited to at least one of the following: the phase-shift change of the phase shifter in different phase intervals, the influence of temperature on the phase-shift of the phase shifter, and the systematic error of the phase shifter. The type of the phase shifter is, for example, an IQ quadrature phase shifter, a transmission line phase shifter, a switch phase shifter, or the like. The compensation information includes, for example, electrical compensation parameters corresponding to the phase-shift phase determined according to the determined phase deviation. The electrical compensation parameters include compensation voltage, compensation duty cycle, or compensation current. For example, the calibration circuit of the phase shifter calculates and stores the corresponding compensation information according to the minimum value of the preset phase-shift phase, the unit phase-shift phase, or the maximum value of the phase-shift phase, respectively. The compensation information includes, for example, any other phase-shift phase between any two phase-shift phases and corresponding other compensation electrical parameters (or other phase deviations) determined according to the any two phase-shift phases and the two phase deviations thereof detected by the calibration circuit. Taking a case in which the phase shifter includes N cascaded transmission line phase shifters and the plurality of transmission line phase shifters provide phase-shifts according to a unit phase-shift phase $\Phi°$ as an example, the phase shifter has a phase deviation of $\Delta\varnothing_1$ corresponding to the phase-shift phase of $0°$ and a phase deviation of $\Delta\varnothing_2$ corresponding to the phase-shift phase of $(N\Phi)°$, which are obtained by detection of the calibration circuit; the phase deviation of the phase-shift phase of each transmission line phase shifter can be a phase deviation which equals to the equally divided the total phase deviation $(\Delta\varnothing_2+\Delta\varnothing_1)$, i.e., $(\Delta\varnothing_2+\Delta\varnothing_1)/N$, so that the compensation information of each transmission line phase shifter is determined according to $(\Delta\varnothing_2+\Delta\varnothing_1)/N$.

Figure 7:
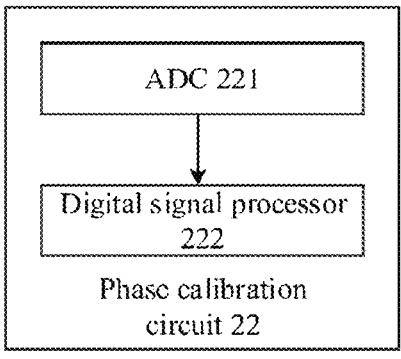
FIG. 7 is a schematic diagram of a phase calibration circuit according to an embodiment of the present disclosure.

In an exemplary embodiment, as shown in FIG. 7, the phase calibration circuit 22 extracts an actual phase to be calibrated using digital signal processing. For this purpose, the phase calibration circuit 22 includes an Analog-to-Digital Converter (ADC) 221 and a digital signal processor 222.

The ADC 221 is coupled to the phase acquisition circuit 20, and is configured to perform analog-to-digital conversion on the second baseband signal and output a second baseband digital signal corresponding to the second baseband signal.

The digital signal processor 222 is coupled to the ADC 221 and configured to determine a phase deviation of the phase shifter by detecting a phase difference between a preset phase-shift phase and an actual phase in the second baseband digital signal; and store calibration phase information for the phase calibration circuit to generate the phase-shift control signal; wherein calibration phase information is the phase deviation or compensation information determined according to the phase deviation.

The digital signal processor determines the phase difference by extracting the actual phase in the second baseband digital signal in the time domain or the frequency domain. For example, the digital signal processor converts the coordinate system of the second baseband digital signal from a time-amplitude coordinate system to a phase-frequency coordinate system to obtain the actual phase expressed by the amplitude. Thereby, the phase difference between the preset phase-shift phase and the above-described actual phase is calculated.

In an example where the initial phase of the first baseband signal is $0°$, the digital signal processor directly obtains the actual phase using time domain-frequency domain conversion.

In an example where the initial phase of the first baseband signal is not $0°$, the digital signal processor obtains phase values containing the initial phase and the actual phase using the time domain-frequency domain conversion, and extracts the actual phase using the initial phase of the first baseband signal in a signal demodulation mode. To this end, in some examples, the initial phase of the first baseband signal may be preset in the digital signal processor for use in demodulation. In some other examples, the ADC is further configured to receive a first baseband signal to perform analog-to-digital conversion on the first baseband signal and output a first baseband digital signal corresponding to the first baseband signal; the digital signal processor is configured to extract the actual phase by detecting a phase difference between the first baseband digital signal and the second baseband digital signal. Here, the ADC may include a two-channel analog-to-digital conversion circuit to digitize the first baseband signal and the second baseband signal, respectively; and the digital signal processor demodulates the first baseband digital signal and the second baseband digital signal using the digital signal demodulation mode to obtain the actual phase. The phase difference between the actual phase and the preset phase-shift phase is calculated; the calibration phase information is obtained using at least one phase difference obtained with at least one calibration, and the calibration phase information is stored.

In an example where the second baseband signal is quadrature signals, the phase calibration circuit performs a separate phase difference calculation for each one channel of signal in the second baseband signals, and the characteristic that there is a $90°$ phase difference between each phase difference and the quadrature signal is used, so that an error caused by the initial phase of the local oscillator signal during the phase difference removing can be removed in one calibration, thereby improving the calibration accuracy.

In the embodiment shown in FIG. 4 or FIG. 6, when the second baseband signal output from the phase acquisition circuit includes an in-phase second baseband signal and a quadrature second baseband signal, the digital signal processor 222 acquires an actual phase in the second baseband signal by the following: acquiring a first actual phase in the in-phase second baseband signal and a second actual phase in the quadrature second baseband signal, and calculating an average value of the first actual phase and the second actual phase to obtain a final actual phase.

The calibration phase information obtained using any of the above examples is used by a phase-shift circuit including any of the above phase shifters, so that the phase-shift circuit, when receiving a phase-shift instruction, can control the phase shifter to convert the phase of the received radio frequency signal into a calibrated actual phase. The calibrated actual phase is closer to the phase-shift phase set in the phase-shift instruction.

The phase-shift circuit includes a calibration circuit, a phase-shift controller, and a phase shifter as provided in any of the above examples. Herein, the phase-shift controller may be integrated in a digital signal processor in the calibration circuit or in a separate circuit connected with the digital signal processor. As shown in FIG. 14, an embodiment of the present disclosure also provides a phase-shift circuit including a phase shifter 10, a calibration circuit 20 and a phase-shift controller 40. The calibration circuit 20 is coupled to the phase shifter 10 and is configured to perform the phase calibration operation as provided in any of the above examples on the phase shifter 10 in a calibration state ①. The phase-shift controller 40 is coupled to the calibration circuit 20 and the phase shifter 10, and receives the phase-shift instruction during the working state ②. The phase-shift controller 40 is configured to output a phase-shift control signal to the phase shifter 10 according to the phase-shift phase in the phase-shift instruction and its stored calibration phase information corresponding to the phase-shift phase. The phase shifter 10 is configured to perform phase-shift processing on the radio frequency signal according to the phase-shift control signal.

Here, the phase-shift controller 40 may be shared in the digital signal processor of the calibration circuit, or may be configured separately and share the same storage area with the digital signal processor. Taking the phase-shift circuit integrated in the radar sensor as an example, the radar sensor generates a phase-shift instruction according to the configured phase-shift strategy, and the phase-shift instruction includes a phase-shift phase to be performed by the phase-shift circuit. The phase-shift controller extracts the phase-shift phase in the corresponding phase-shift instruction via the interaction with the memory, acquires calibration phase information corresponding to the phase-shift phase, and converts the calibration phase information into a phase-shift control signal, such as a voltage signal, a current signal, or a Pulse Width Modulation (PWM) signal, which may be recognized by the phase shifter. The phase-shift control signal is intended to control the adjustable circuit in the phase shifter 10 to adjust the phase of the radio frequency signal received by the phase shifter to the phase-shift phase, thereby reducing the phase-shift deviation of the phase shifter caused by factors such as external environment, operating voltage, manufacturing process.

In an exemplary embodiment, the embodiment of the present disclosure further provides a radio frequency transmitting circuit, which may be referred to as a radio frequency transmitting system, including a local oscillator circuit, a phase-shift circuit of any of the foregoing embodiments, and an antenna transmitting system. The phase-shift circuit shifts the phase of the radio frequency signal generated by the local oscillator circuit and inputs it into the antenna transmitting system, then the antenna transmitting system converts it into an electromagnetic wave for radiation. For example, in the calibration state, the local oscillator circuit generates a radio frequency signal and sends it to the phase-shift circuit. After phase-shifting, the phase-shift circuit transmits the phase-shifted radio frequency signal to the antenna transmitting system, and the antenna transmitting system transmits an electromagnetic wave signal. In this process, the calibration circuit in the phase-shift circuit can perform at least one calibration operation on the phase shifter. For example, the calibration circuit obtains a radio frequency signal corresponding to a preset phase-shift phase $\theta i$ output from the phase shifter at time i, obtains a phase difference $\Delta\theta i$ between the actual phase $\theta'i$ of the radio frequency signal and the phase-shift phase $\theta i$ by any of the aforementioned methods, and stores it as the corresponding calibration phase information. The calibration circuit re-performs the calibration operations at different times (such as time i+1, time i+2, etc.) using different phase-shift phases $\theta(i+1)$, $\theta(i+2)$, etc., according to the calibration strategy, so as to determine the calibration phase information corresponding to any phase-shift phase using the obtained different phase differences, or determine the calibration phase information corresponding to the phase-shift phases obtained based on different phase-shift steps.

In a working state, the phase-shift controller reads the corresponding calibration phase information according to the received phase-shift instruction, generates a phase-shift control signal to feed back to the phase shifter. The phase shifter outputs the radio frequency signal with the calibrated phase-shift phase so that the phase-shifted phase of the output radio frequency signal conforms to the preset phase-shift phase set by the phase-shift instruction.

In the radio frequency transmitting circuit, the radio frequency signal output from the phase-shift circuit is output to the antenna transmitting system. The antenna transmitting system converts a radio frequency signal provided by the signal transmitter (such as a local oscillator circuit) into an electromagnetic wave by means of electromagnetic conversion, and radiates it to free space. In order to achieve electromagnetic conversion, the antenna transmitting system includes a radiation part and a feeding part. Herein, the radiation part is usually implemented in the metal layer in the integrated circuit in a patterned form. The radiation part includes, for example, a radiation structure of a patch or a radiation structure of a slot. The feeding part is coupled between the signal transmitter and the radiation part for transmitting a varied electrical signal. For example, the feeding part transmits the varied electrical signal (a frequency-multiplied and phase-shifted radio frequency signal) output from the signal generator to the radiation part, so that the radiation part can convert the varied electrical signal into an electromagnetic wave.

Using the phase shifter, the radio frequency transmitting circuit can change the radiation direction of the transmitting antenna without adjusting the structure of the antenna transmitting system, thus achieving the purpose of phase control and reducing radar interference.

In an exemplary embodiment, the embodiment of the present disclosure further provides a radio frequency receiving circuit, which includes an antenna receiving system, a phase-shift circuit of any of the above embodiments, a local oscillator circuit and a frequency mixer. The antenna receiving system converts an electromagnetic wave into a radio frequency receiving signal (or a radio frequency signal). The phase of the radio frequency receiving signal is shifted by the phase-shift circuit, and then the phased-shifted radio frequency receiving signal is input into a frequency mixer together with a local oscillator signal output from the local oscillator circuit, and a difference frequency signal is output after down-conversion. In the calibration state, the phase-shift circuit in the radio frequency receiving circuit and the phase-shift circuit in the radio frequency transmitting circuit have the same or similar calibration process. In a working state, the phase-shift circuit in the radio frequency receiving circuit and the phase-shift circuit in the radio frequency transmitting circuit have the same or similar working process.

In the radio frequency receiving circuit, similar to the structure of the antenna transmitting system in the radio frequency transmitting circuit, the antenna receiving system converts electromagnetic waves in a specific frequency band in the free space into radio frequency receiving signals. Different from the above-mentioned radio frequency transmitting circuit, in the radio frequency receiving circuit, the antenna receiving system outputs the radio frequency receiving signal to the phase-shift circuit. Taking a case in which the radio frequency receiving circuit is included in the radar sensor as an example, by using a phase shifter, the radio frequency receiving circuit can change the detection direction of the receiving antenna without adjusting the structure of the antenna receiving system, thus achieving the purpose of phase control and reducing radar interference.

Embodiments of a radio frequency transmitting circuit and a radio frequency receiving circuit including a phase-shift circuit are exemplified below by some application embodiments.

Figure 8:
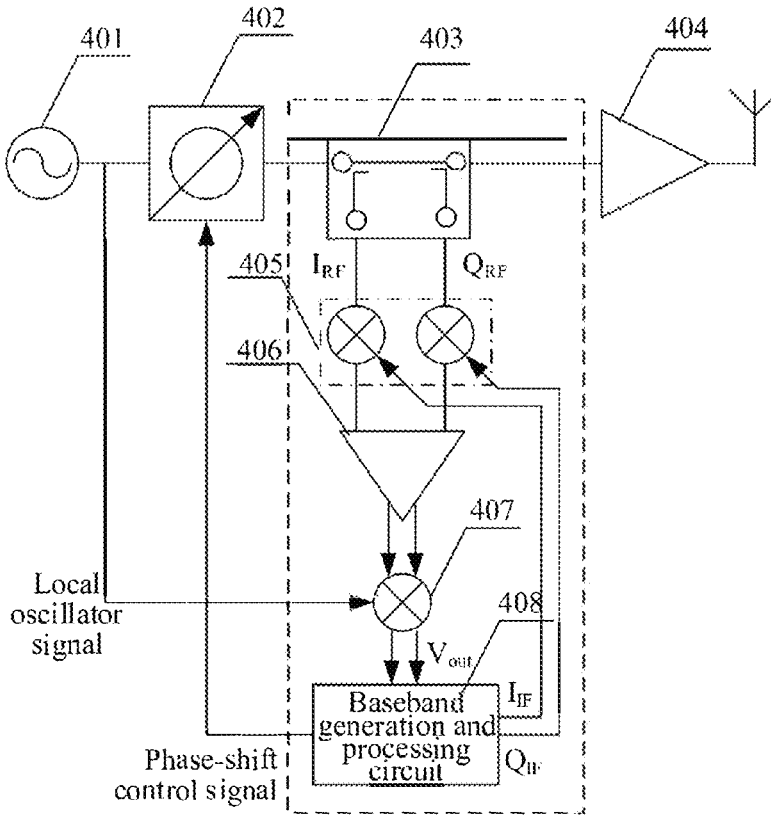
FIG. 8 is a schematic diagram of a radio frequency transmitting circuit according to an embodiment of the present disclosure.

FIG. 8 shows a radio frequency transmitting circuit according to an embodiment of the present disclosure. The radio frequency transmitting circuit includes a local oscillator circuit 401, a phase-shift circuit (including a phase shifter 402 and a calibration circuit), a power amplifier 404, and an antenna transmitting system. The calibration circuit is shown in the dotted line in the figure. In this example, the calibration circuit includes a quadrature coupler 403 (i.e., the aforementioned radio frequency acquisition circuit), a quadrature frequency mixer 405 (i.e., the aforementioned modulation circuit), an amplifier 406, a frequency mixer 407 (i.e., the aforementioned frequency converter circuit), and a baseband generation and processing circuit 408 (which is a combination of the aforementioned baseband signal generation circuit and phase calibration circuit). The quadrature coupler 403 couples out the output signal of the phase shifter 402 in a certain proportion, and the coupled-out signal is not only large enough to accurately reflect the output performance of the phase shifter 402, but also not too large to affect the operation of the power amplifier. In this example, the output of the quadrature coupler 403 is a pair of radio frequency signals or radio frequency sample signals with a phase difference of 90 degrees (i.e., IRF and QRF in the figure, which are high frequency signals); the baseband generation and processing circuit 408 generates a first baseband signal (i.e., IIF and QIF in the figure) for providing calibration, the frequency of which may range from tens of KHz to hundreds of MHz. Sinece the first baseband signal belongs to a low frequency signal, the signal can be easily processed (e.g., phase extraction). Frequency mixing is performed on the first baseband signal generated by the baseband generation and processing circuit 408 and the radio frequency signal output from the quadrature coupler 403, in the quadrature frequency mixer 405 (IRF–IIF, QRF–QIF, or IRF+IIF, QRF+QIF) to generate two channels of signals with single-sideband characteristics, i.e., the abovementioned modulation signals, which are amplified by the amplifier 406 and input to the frequency mixer 407. The frequency mixer 407 also receives the local oscillator signal from the local oscillator circuit 401 at the same time. The mixer 407 performs down-conversion processing and outputs two second baseband signals Vout, which have the same frequencies as IIF and QIF due to the down-conversion processing, and the Vout contains phase information output by the phase shifter 402. When the phase shifter 402 is adjusted to make the phase of the radio frequency signal be changed by a certain degree, the phase of Vout is also changed by the corresponding degree, and because the frequency of Vout is very low, it can be easily and accurately measured and recorded in the baseband generation and processing circuit 408 to obtain the phase output by the phase shifter 402. The baseband generation and processing circuit 408 obtains the phases in the two second baseband signals, respectively, and obtains the actual phase of the radio frequency signal by means of value average processing. When the actual phase of the phase shifter 402 has an error compared with the target phase, i.e., the preset phase-shift phase, the baseband generation and processing circuit 408 may send a corresponding phase-shift control signal according to the phase error, and the phase shifter 402 may be adjusted according to the phase-shift control signal until the error converges to an acceptable value. Therefore, the accurate calibration for the radio frequency phase shifter is achieved.

In this embodiment, the phase change amount of the phase shifter can be known by measuring the phase change amount of Vout by utilizing the feature that the phase of the second baseband signal Vout can track the phase of the phase shifter, thereby, when the phase change amount of the Vout is found to be inconsistent with an expectation, the phase shifter is adjusted by means of a feedback signal, i.e., a phase-shift control signal.

The baseband generation and processing circuit 408 is integrated with a phase-shift controller to generate a phase-shift control signal according to the stored calibration phase information after calibration. The phase of the radio frequency signal output by the phase shifter is controlled by the phase-shift control signal, which is the calibrated phase-shift phase. In a working state, the local oscillator circuit 401 generates a radio frequency signal and outputs it to the phase shifter 402. Under the control of an upper layer phase-shift instruction, the baseband generation and processing circuit 408 outputs a phase-shift control signal to the phase shifter 402 according to the phase-shift phase in the phase-shift instruction, herein, the phase-shift control signal represents a calibrated phase-shift phase information. The phase shifter 402 outputs a radio frequency signal conforming to the phase-shift phase according to the phase-shift control signal and inputs it to the power amplifier 404. The power amplifier 404 amplifies the output power of the radio frequency signal to drive the antenna transmitting system to convert the radio frequency signal into an electromagnetic wave, and then the electromagnetic wave is radiated to the free space.

Figure 9:
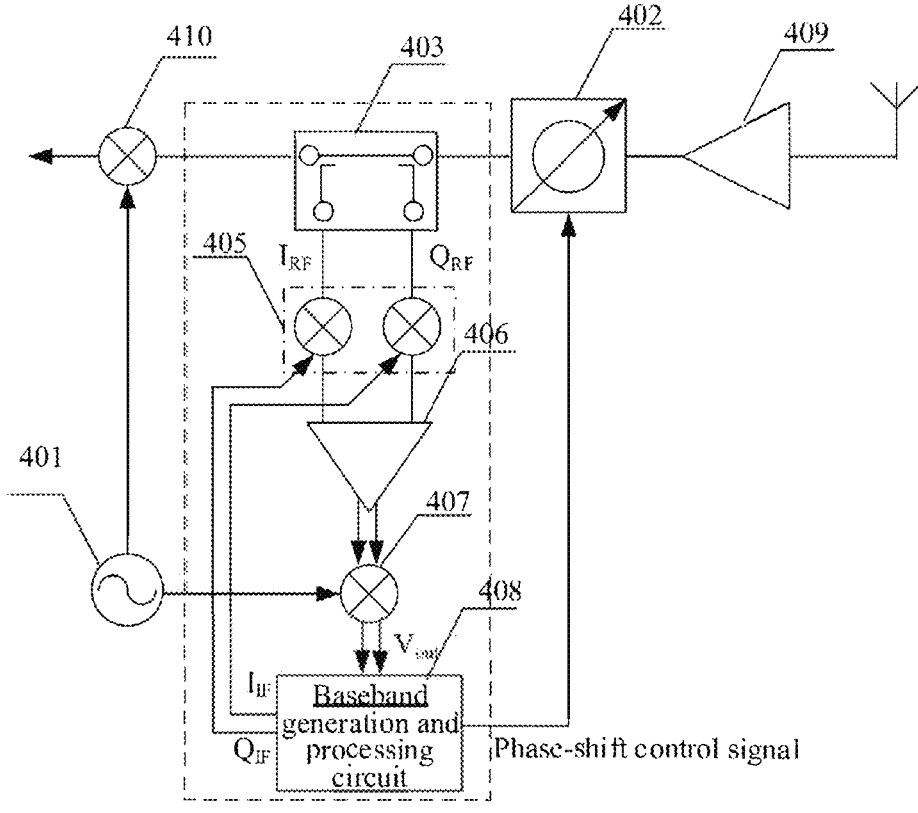
FIG. 9 is a schematic diagram of a radio frequency receiving circuit according to an embodiment of the present disclosure.

FIG. 9 shows a radio frequency receiving circuit according to an embodiment of the present disclosure. The radio frequency receiving circuit includes an antenna receiving system, a low noise amplifier 409, a phase-shift circuit (including a phase shifter and a calibration circuit), a local oscillator circuit and a receiver frequency mixer 410. The antenna receiving system receives an external radio frequency or microwave signal, the low noise amplifier 409 amplifies the signal, the phase-shift circuit adjusts the phase of the signal, and finally the receiver frequency mixer 410 down-converts the signal and outputs an intermediate frequency signal. In this example, the phase shifter circuit includes a phase shifter 402 and a calibration circuit within the dotted line in the figure. In this example, the calibration circuit includes a quadrature coupler 403, a quadrature frequency mixer 405, an amplifier 406, a frequency mixer 407 and a baseband generation and processing circuit 408. The quadrature coupler 403 couples out the output signal of the phase shifter 402 in a certain proportion, so that the coupled-out signal is not only large enough to accurately reflect the output performance of the phase shifter, but also not too large to affect the operation of the power amplifier. In this example, the output of the quadrature coupler 403 is a pair of radio frequency sample signals with a phase difference of 90 degrees (i.e., IRF and QRF in the figure, which are high frequency signals); the baseband generation and processing circuit 408 generates a first baseband signal (i.e., $I_{IF}$ and $Q_{IF}$ in the figure) for calibration, the first baseband signal may have a frequency ranging from several tens of KHz to hundreds of MHz to facilitate processing. Frequency mixing in the quadrature frequency mixer 405 is performed on the first baseband signal generated by the baseband generation and processing circuit 408 and the radio frequency sample signal output from the quadrature coupler 403, to generate two channels of signals with single-sideband characteristics, i.e., the above-mentioned modulation signals, which are amplified by the amplifier 406 and input to the frequency mixer 407. The frequency mixer 407 also receives a local oscillator signal from the local oscillator circuit 401 (which may use a local oscillator circuit in the radio frequency transmitting circuit) at the same time. The frequency mixer 407 performs down-conversion processing and outputs two second baseband signals Vout having the same frequencies as $I_{IF}$ and $Q_{IF}$, and the Vout contains the output phase information of the phase shifter 402. When the phase shifter 402 is adjusted to change the phase of the radio frequency signal by a certain degree, the phase of Vout is also changed by a corresponding degree, and since the frequency of Vout is low, it can be easily and accurately measured and recorded in the baseband generation and processing circuit 408 to obtain the phase of the output of the phase shifter 402. The baseband generation and processing circuit 408 obtains the phases in the two channels of second baseband signals, respectively, and obtains the actual phase of the radio frequency signal by means of value average processing. When the actual phase of the phase shifter 402 has an error compared with the target phase, the baseband generation and processing circuit 408 may send a corresponding phase-shift control signal according to the phase error, and the phase shifter 402 may be adjusted according to the phase-shift control signal until the error converges to an acceptable value. Therefore, the accurate calibration for the radio frequency phase shifter is achieved.

The baseband generation and processing circuit 408 is further integrated with a phase-shift controller to generate a phase-shift control signal according to the stored calibration phase information after calibration. The phase of the radio frequency signal output from the phase shifter is controlled by the phase-shift, which is the calibrated phase-shift phase. Taking a case in which the radar sensor includes any of the aforementioned radio frequency receiving circuits as an example, in a working state, the local oscillator circuit 401 generates a radio frequency signal and outputs it to the phase shifter 402 and the receiver frequency mixer 410, and the antenna receiving system converts an electromagnetic wave in the free space into a radio frequency receiving signal and outputs it after being amplified by the low noise amplifier 409. Under the control of an upper layer phase-shift instruction, the baseband generation and processing circuit 408 outputs a phase-shift control signal to the phase shifter 402 according to the phase-shift phase in the phase-shift instruction, herein, the phase-shift control signal represents the calibrated phase-shift phase information. The phase shifter 402 outputs a radio frequency receiving signal conforming to the phase-shift phase according to the phase-shift control signal and inputs it to the receiver frequency mixer 410. The receiver frequency mixer 410 performs down-conversion processing on the phase-shifted radio frequency receiving signal using a local oscillator signal to output a baseband signal carrying the phase-shift information. The baseband signal is used for the subsequent circuit to calculate the information of the target object detected in the radiation direction under the control of the phase-shift controller.

Figure 10:
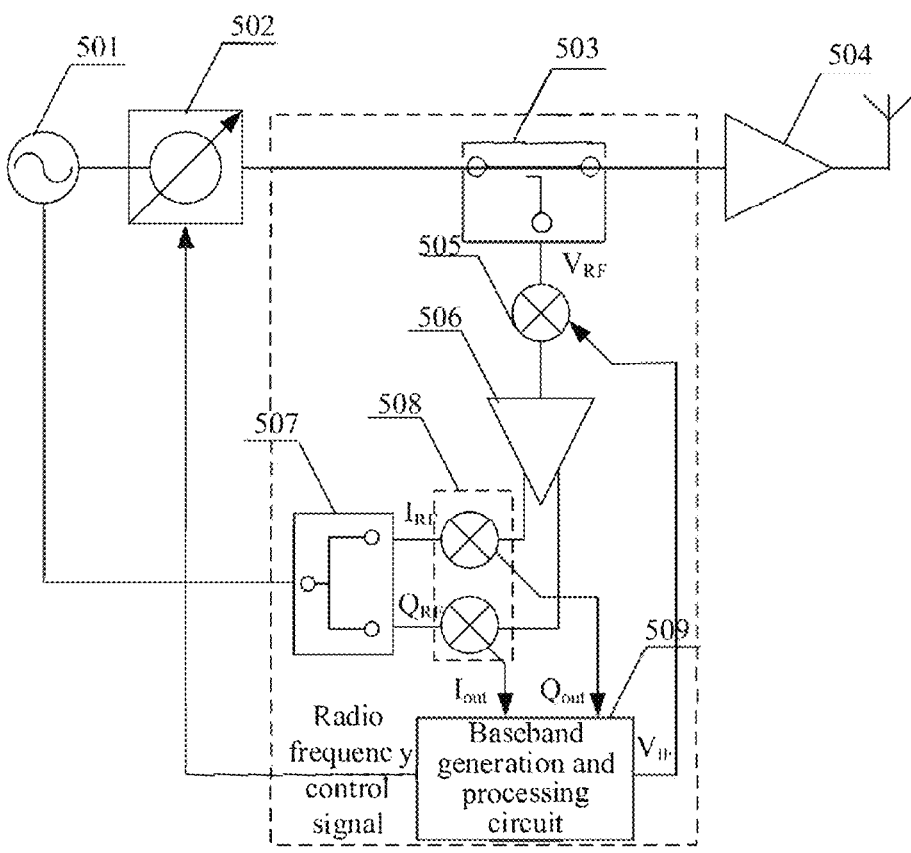
FIG. 10 is a schematic diagram of another radio frequency transmitting circuit according to an embodiment of the present disclosure.

FIG. 10 shows another radio frequency transmitting circuit according to an embodiment of the present disclosure. The radio frequency transmitting circuit includes a local oscillator circuit 501, a phase-shift circuit, a power amplifier 504 and an antenna transmitting system, wherein the phase-shift circuit includes a phase shifter 502 and a calibration circuit, and the calibration circuit is shown in the dotted line in the figure. Compared with FIG. 8, the calibration circuit of the present embodiment includes a single-ended coupler 503 (i.e., the aforementioned radio frequency acquisition circuit), a frequency mixer 505 (i.e., the aforementioned modulation circuit), an amplifier 506, a frequency converter circuit (including a quadrature coupler 507 and a quadrature frequency mixer 508), and a baseband generation and processing circuit 509. The single-ended coupler 503 couples out the output signal of the phase shifter 502 in a certain proportion and inputs it to the frequency mixer 505. The baseband generation and processing circuit 509 generates a first baseband signal (i.e., $V_{IF}$ in the figure) for calibration. After frequency mixing in the quadrature frequency mixer 405 is performed on the first baseband signal generated by the baseband generation and processing circuit 509 and the radio frequency sample signal output from the single-ended coupler 503 ($V_{RF}$–$V_{IF}$ Or $V_{RF}$+$V_{IF}$), a signal with a single-sideband characteristic may be generated that is, a modulation signal, the modulation signal is amplified by the amplifier 506 and sent to the quadrature frequency mixer 508. The quadrature mixer 508 also receives the local oscillator signal from the local oscillator circuit 501 at the same time. In this example, the local oscillator signal output from the local oscillator circuit 501 passes through the quadrature coupler 507 when it enters the calibration circuit to produce two local oscillator signals with a phase difference of 90 degrees (i.e., IRF and QRF in the figure). The quadrature frequency mixer 508 performs down-conversion processing to obtain baseband signals $I_{out}$ and $Q_{out}$ with quadrature relationship, $I_{out}$ and $Q_{out}$ have the same frequency as $V_{IF}$ and contain phase information output by the phase shifter 502. The phases of $I_{out}$ and $Q_{out}$ may be accurately measured and recorded in the baseband generation and processing circuit 408 to obtain the phase output by the phase shifter 502. The baseband generation and processing circuit 408 obtains the phases of the two second baseband signals, respectively, and obtains the actual phase of the radio frequency signal by means of value average processing. When the actual phase of the phase shifter 502 after measurement has an error compared with the target phase, the baseband generation and processing circuit 509 may send a corresponding phase-shift control signal according to the phase error, and the phase shifter 502 may be adjusted according to the phase-shift control signal until the error converges to an acceptable value. Therefore, the accurate calibration for the radio frequency phase shifter is achieved.

Figure 11:
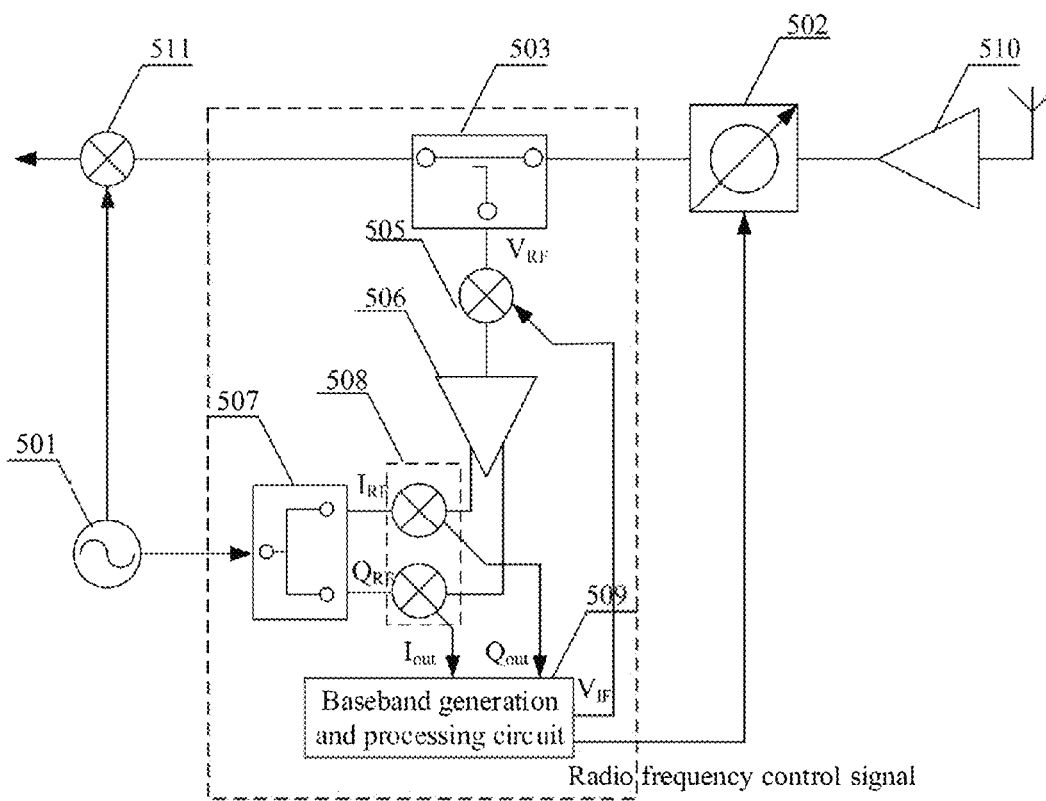
FIG. 11 is a schematic diagram of another radio frequency receiving circuit according to an embodiment of the present disclosure.

FIG. 11 shows another radio frequency receiving circuit according to an embodiment of the present disclosure. The radio frequency receiving circuit includes an antenna receiving system, a low noise amplifier 510, a phase-shift circuit, a local oscillator circuit and a receiver frequency mixer 511. In this example, the phase shifter circuit includes a phase shifter 502 and a calibration circuit, and the calibration circuit is shown in the dotted line in the figure. In this example, the calibration circuit includes a single-ended coupler 503, a frequency mixer 505, an amplifier 506, a quadrature frequency mixer 508, a quadrature coupler 507 and a baseband generation and processing circuit 509. Compared with FIG. 9, in the calibration circuit of the present embodiment, the output of the phase shifter uses a single-ended coupler 503, and the single-ended coupler 503 outputs a radio frequency sample signal (i.e., $V_{RF}$ in the figure, which is a high frequency signal), the baseband generation and processing circuit 509 generates a first baseband signal (i.e., $V_{IF}$ in the figure) for calibration, frequency mixing in the frequency mixer 505 is performed on the first baseband signal generated by the baseband generation and processing circuit 509 and the radio frequency sample signal output from the single-ended coupler 503, and the obtained modulation signal is amplified by the amplifier 506 and input into the quadrature frequency mixer 508. The quadrature frequency mixer 508 also receives the local oscillator signal from the local oscillator circuit 501 (which may use the local oscillator circuit in the radio frequency transmitting circuit) at the same time. In this example, the local oscillator signal output from the local oscillator circuit 501 passes through the quadrature coupler 507 when it enters the calibration circuit to produce two channels of local oscillator signals with a phase difference of 90 degrees (i.e., IRF and QRF in the figure). The quadrature frequency mixer 508 performs down-conversion processing to obtain baseband signals $I_{out}$ and $Q_{out}$ with quadrature relationship, the baseband signals $I_{out}$ and $Q_{out}$ have the same frequency as $V_{IF}$ and contain phase information output by the phase shifter 502. Wince the frequencies of $I_{out}$ and $Q_{out}$ are low, it can be easily and accurately measured and recorded in the baseband generation and processing circuit 509 to obtain the actual phase of the phase shifter 502. When the actual phase of the phase shifter 502 has an error compared with the target phase, the baseband generation and processing circuit 509 may send a corresponding phase-shift control signal according to the phase error, and the phase shifter 502 may be adjusted according to the phase-shift control signal until the error converges to an acceptable value. Therefore, the accurate calibration for the radio frequency phase shifter is achieved.

Figure 12:
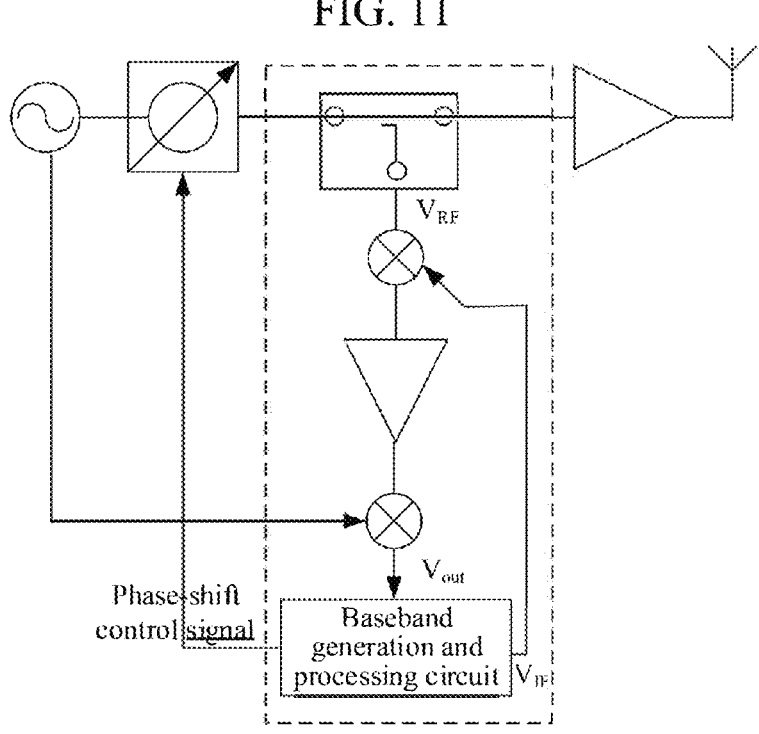
FIG. 12 is a schematic diagram of yet another radio frequency transmitting circuit according to an embodiment of the present disclosure.

FIG. 12 shows another radio frequency transmitting circuit according to an embodiment of the present disclosure. In this example, the calibration circuit includes a single-ended coupler (i.e., the aforementioned radio frequency acquisition circuit), a first frequency mixer (i.e., the aforementioned modulation circuit), an amplifier, a second frequency mixer (i.e., the aforementioned frequency converter circuit) and a baseband generation and processing circuit (including the aforementioned baseband signal generation circuit and phase calibration circuit). Single-ended signal processing is adopted in this example. One channel of radio frequency sample signal is coupled out by the single-ended coupler, and frequency mixing is performed on the channel of radio frequency sample signal and the first baseband signal output by the baseband generation and processing circuit, and the modulation signal, obtained after frequency mixing, is amplified by the amplifier and then input to the second frequency mixer for down-conversion processing to obtain a second baseband signal. The second baseband signal contains the actual phase information of the phase shifter. The baseband generation and processing circuit extracts the actual phase information, and an error determination is performed, and the phase shift control signal is sent to the phase shifter according to the determination result. The radio frequency receiving circuit may use a similar configuration, which will not be repeated in this embodiment.

In an exemplary embodiment, the embodiment of the present disclosure further provides a calibration method for a phase shifter, as shown in FIG. 13, including the following acts S1-S4.

In act S1, a radio frequency signal carrying an actual phase is acquired, wherein the radio frequency signal is output by the phase shifter.

In act S2, the radio frequency signal is modulated using a first baseband signal.

In act S3, the modulated radio frequency signal is down-converted to a baseband to obtain a second baseband signal containing the actual phase.

In act S4, the actual phase in the second baseband signal is acquired, a calibration phase of the phase shifter is determined according to a phase deviation between the actual phase and a preset phase-shift phase, and a phase-shift control signal is transmitted to the phase shifter according to the calibration phase.

The implementation body, implementation process and effect of the method can be described with reference to the aforementioned embodiments, which will not be repeated here.

In an exemplary embodiment, the embodiment of the present disclosure further provides a radar sensor, which may include the aforementioned radio frequency transmitting circuit and/or radio frequency receiving circuit. The radar sensor measures a physical quantity between the radar sensor and an surrounding environment target using a detection signal wave transmitted by the radio frequency transmitting circuit and an echo signal wave received by the radio frequency receiving circuit, for example, to measure at least one of a relative velocity, a relative angle, a relative distance, and a three-dimensional profile of the target.

Exemplarily, the radar sensor includes a radio frequency transmitting circuit and/or a radio frequency receiving circuit. Herein, the radio frequency transmitting circuit and the radio frequency receiving circuit each determine a circuit structure based on the surrounding environment measured by the radar sensor, so as to transmit a detection signal wave in a preset frequency band or a fixed frequency, and to receive an echo signal wave at the preset frequency band or a fixed frequency, and perform signal processing on the corresponding varied electrical signal. Herein, the radio frequency transmitting circuit or the radio frequency receiving circuit is the corresponding circuits provided by any of the above examples to achieve phase-controlled detection or reduce radar interference.

For example, the radio frequency transmitting circuit generates a chirp signal (such as Frequency Modulated Continuous Wave (FMCW) signal) according to a preset continuous frequency modulation mode; a radio frequency transmitting signal is obtained by performing frequency multiplication processing on the chirp signal, and after the phase of the radio frequency transmitting signal is shifted by the phase-shift circuit, and the phase-shifted radio frequency transmitting signal is fed to the transmitting antenna to transmit a corresponding detection signal wave. When the detection signal wave is reflected by an object, an echo signal wave is formed. The echo signal wave is converted into a radio frequency receiving signal by a receiving antenna. The radio frequency receiving circuit is configured to perform down-conversion, filtering, analog-to-digital conversion and the like on the radio frequency receiving signal using the radio frequency transmitting signal (i.e., the above-mentioned local oscillator signal) to output a baseband digital signal representing a difference frequency between the detection signal wave and the echo signal wave. The radar sensor may further include a signal processor, which may be coupled to the radio frequency receiving circuit and configured to extract measurement information from the baseband digital signal through signal processing and output measurement data. The measurement data may help to determine the angular information of the detected target because it contains the phase-shift phase. Herein, the signal processing includes performing digital signal processing and calculation such as processing in phase, in frequency, or in time domain, etc., on at least one signal to be processed provided by at least one receiving antenna. The measurement data includes at least one of the following: distance data indicating a relative distance of the detected at least one target; velocity data indicating the relative velocity of the detected at least one target; and angle data indicating the relative angle of the detected at least one target, etc.

In an exemplary embodiment, the embodiment of the present disclosure further provides an electronic device including at least one of the aforementioned phase-shift circuit, the aforementioned radio frequency transmitting circuit, the aforementioned radio frequency receiving circuit, and the aforementioned radar sensor.

Exemplarily, the electronic device includes a device body; and at least one radio device of a phase-shift circuit, a radio frequency transmitting circuit, a radio frequency receiving circuit, or a radar sensor as described in the above embodiments which is arranged on the device body. Herein, the device body is a structure which carries a radio device and signals with the radio device. The radio device implements functions such as target detection and/or communication within the range of beam scanning by transmitting and/or receiving the radio signal phase-shifted by the phase shifter, so as to provide detection target information and/or communication information to the device body, and further assist or even control the operation of the device body.

In an optional embodiment, the above electronic device including the device body and the above-mentioned at least one radio device may be components and products applied to fields such as smart houses, transportation, smart homes, consumer electronics, monitoring, industrial automation, in-cabin detection and health care. For example, the device body may be smart transportation device (such as automobile, bicycle, motorcycle, ship, subway, train, etc.), security device (such as camera), liquid level/flow rate detection device, smart wearable device (such as bracelet, glasses, etc.), smart home device (such as sweeping robot, door lock, television, air conditioner, smart light, etc.), various communication devices (such as mobile phone, tablet computer, etc.), as well as road gate, smart traffic light, smart sign, traffic camera and various industrial mechanical arms (or robots), etc. The device body may be various instruments for detecting vital signs parameters and various devices equipped with the instruments, such as detection device in automobile cabin, indoor personnel monitoring device, intelligent medical device, consumer electronic device, etc.

The invention claimed is:

1. A calibration circuit for a phase shifter, the phase shifter being coupled to the calibration circuit, and the calibration circuit comprising a phase acquisition circuit and a phase calibration circuit, wherein:
    the phase acquisition circuit is coupled to the phase shifter, and is configured to acquire a radio frequency sample signal from the phase shifter, modulate the radio frequency sample signal through frequency mixing with a first baseband signal to obtain a modulation signal carrying an actual phase, down-convert the modulation signal to a baseband to obtain a second baseband signal carrying the actual phase, and output the second baseband signal; wherein the actual phase is a phase of a radio frequency signal output by the phase shifter; and the first baseband signal is an intermediate frequency signal or a low frequency signal with a preset initial phase; and
    the phase calibration circuit is coupled to the phase acquisition circuit, and is configured to receive the second baseband signal from the phase acquisition circuit, determine a phase deviation of the phase shifter by detecting a phase difference between a preset phase-shift phase and the actual phase carried in the second baseband signal, determine calibration phase information according to the phase deviation, store the calibration phase information, generate a phase-shift control signal according to the calibration phase information, and transmit the phase-shift control signal to the phase shifter; wherein the calibration phase information is the phase deviation, or compensation information determined according to the phase deviation.

2. The calibration circuit according to claim 1, wherein the second baseband signal is a pair of quadrature signals.

3. The calibration circuit according to claim 1, wherein the phase acquisition circuit comprises a radio frequency acquisition circuit, a modulation circuit, and a frequency converter circuit, wherein:
    the radio frequency acquisition circuit is coupled to the phase shifter, and is configured to acquire the radio frequency signal output by the phase shifter, and output the radio frequency sample signal;
    the modulation circuit is coupled to the radio frequency acquisition circuit, and is configured to receive the first baseband signal, modulate the radio frequency sample signal using the first baseband signal to obtain the modulation signal carrying the actual phase, and output the modulation signal; and
    the frequency converter circuit is coupled to the modulation circuit, and is configured to receive a local oscillator signal, perform down-conversion processing on the modulation signal using the local oscillator signal to obtain the second baseband signal carrying the actual phase, and output the second baseband signal.

4. The calibration circuit according to claim 3, wherein:
    the first baseband signal is a pair of quadrature signals which comprise an in-phase first baseband signal and a quadrature first baseband signal;
    the radio frequency acquisition circuit comprises a first quadrature coupler, the first quadrature coupler comprises an in-phase output and a quadrature output, the modulation circuit comprises a first modulator connected with the in-phase output and a second modulator connected with the quadrature output;
    the first quadrature coupler is coupled to the phase shifter, and is configured to acquire the radio frequency signal output by the phase shifter, and output the radio frequency sample signal, wherein the radio frequency sample signal is a pair of quadrature signals which comprise an in-phase radio frequency sample signal and a quadrature radio frequency sample signal; and
    the first modulator is configured to modulate the in-phase radio frequency sample signal using the in-phase first baseband signal and output a first modulation signal, the second modulator is configured to modulate the quadrature radio frequency sample signal using the quadrature first baseband signal and output a second modulation signal, wherein the first and second modulation signals respectively output by the first modulator and the second modulator are a pair of quadrature signals.

5. The calibration circuit according to claim 3, wherein:
    the first baseband signal is one channel of signal;
    the radio frequency acquisition circuit comprises a single-ended coupler, the single-ended coupler is coupled with the phase shifter and is configured to acquire the radio frequency signal output by the phase shifter and output the radio frequency sample signal; and
    the modulation circuit is configured to modulate the radio frequency sample signal from the single-ended coupler using the first baseband signal and output the modulation signal; wherein, the modulation signal is one channel of signal or a pair of quadrature signals.

6. The calibration circuit according to claim 3, wherein:
    the modulation signal is a pair of quadrature signals; and
    the frequency converter circuit comprises a plurality of first frequency mixers, each of which is configured to receive one channel of signal in the modulation signal, each first frequency mixer is configured to perform down-conversion processing on a corresponding channel of signal in the modulation signal using the local oscillator signal, wherein the second baseband signal output by the frequency converter circuit is a pair of quadrature signals.

7. The calibration circuit according to claim 3, wherein:
the modulation signal is one channel of signal;
the frequency converter circuit comprises a second quadrature coupler and two second frequency mixers;
the second quadrature coupler is coupled to a local oscillator circuit, and is configured to convert one channel of local oscillator signal output by the local oscillator circuit into a pair of quadrature signals and output the pair of quadrature signals which comprise an in-phase local oscillator signal and a quadrature local oscillator signal, wherein the second quadrature coupler comprises an in-phase output for outputting the in-phase local oscillator signal and an quadrature output for outputting the quadrature local oscillator signal; and
one second frequency mixer is connected with the in-phase output, and is configured to perform down-conversion processing on the modulation signal using the in-phase local oscillator signal; the other second frequency mixer is connected with the quadrature output, and is configured to perform down-conversion processing on the modulation signal using the quadrature local oscillator signal; wherein the second baseband signal output by the frequency converter circuit is a pair of quadrature second baseband signals both carrying the actual phase.

8. The calibration circuit according to claim 1, wherein an amplifier is provided on each signal transmission path in the phase acquisition circuit to perform signal amplification.

9. The calibration circuit according to claim 8, wherein a signal amplified by the amplifier is the modulation signal.

10. The calibration circuit according to claim 8, wherein the signal transmission path comprises one transmission path for transmitting a single-ended signal, or two transmission paths for transmitting a pair of quadrature signals.

11. The calibration circuit according to claim 1, wherein:
the phase calibration circuit comprises an Analog-to-Digital Conversion (ADC) and a digital signal processor; the ADC is coupled to the phase acquisition circuit, and is configured to perform analog-to-digital conversion on the second baseband signal and output a second baseband digital signal corresponding to the second baseband signal; and
the digital signal processor is coupled to the ADC, and is configured to determine the phase deviation of the phase shifter by detecting a phase difference between the preset phase-shift phase and the actual phase in the second baseband digital signal, store calibration phase information, and generate the phase-shift control signal according to the calibration phase information; wherein the calibration phase information is the phase deviation, or compensation information determined according to the phase deviation.

12. The calibration circuit according to claim 11, wherein:
the ADC is further configured to receive the first baseband signal, perform analog-to-digital conversion on the first baseband signal, and output a first baseband digital signal corresponding to the first baseband signal; and
the digital signal processor is configured to detect a phase difference between the first baseband digital signal and the second baseband digital signal, and extract the actual phase according to the phase difference.

13. The calibration circuit according to claim 11, wherein:
the digital signal processor is configured to detect the phase difference between the preset phase-shift phase and the actual phase in a frequency domain.

14. A phase-shift circuit, comprising a phase-shift controller, a phase shifter, and the calibration circuit according to claim 1, wherein:
the calibration circuit is coupled to the phase shifter, and is configured to transmit the phase-shift control signal to the phase shifter through the phase-shift controller in a calibration state;
the phase-shift controller is coupled to the calibration circuit and the phase shifter, and is configured to receive a phase-shift instruction, containing a phase-shift phase, in a working state, and output the phase-shift control signal according to the stored calibration phase information corresponding to the phase-shift phase; and
the phase shifter is configured to perform phase-shift processing on a radio frequency signal according to the phase-shift control signal.

15. The phase-shift circuit according to claim 14, wherein the phase shifter
comprises an IQ phase shifter or a transmission line phase shifter.

16. A radio frequency transmitting circuit, comprising a local oscillator circuit, the phase-shift circuit according to claim 14, and an antenna transmitting system, wherein:
the local oscillator circuit is configured to output a generated radio frequency transmitting signal to the phase-shift circuit, the phase-shift circuit is configured to shift a phase of the radio frequency transmitting signal and input the phase-shifted radio frequency transmitting signal to the antenna transmitting system, and the antenna transmitting system is configured to convert the phase-shifted radio frequency transmitting signal into an electromagnetic wave, and radiate the electromagnetic wave.

17. A radio frequency receiving circuit, comprising an antenna receiving system, the phase-shift circuit according to claim 14, a local oscillator circuit, and a frequency mixer, wherein,
the antenna receiving system is configured to convert an electromagnetic wave into a radio frequency receiving signal, the phase-shift circuit is configured to shift a phase of the radio frequency receiving signal and input the phase-shifted radio frequency receiving signal into the frequency mixer, and the frequency mixer is configured to outputs a down-converted difference frequency signal using a local oscillator signal output by the local oscillator circuit.

18. A radar sensor, comprising a radio frequency transmitting circuit and/or a radio frequency receiving circuit, wherein,
the radio frequency transmitting circuit comprises a local oscillator circuit, a phase-shift circuit, and an antenna transmitting system, the local oscillator circuit is configured to output a generated radio frequency transmitting signal to the phase-shift circuit, the phase-shift circuit is configured to shift a phase of the radio frequency transmitting signal and input the phase-shifted radio frequency transmitting signal to the antenna transmitting system, and the antenna transmitting system is configured to convert the phase-shifted radio frequency transmitting signal into an electromagnetic wave, and radiate the electromagnetic wave; the radio frequency receiving circuit comprises an antenna receiving system, another phase-shift circuit, the local oscillator circuit, and a frequency mixer, the antenna receiving system is configured to convert the electro- magnetic wave into a radio frequency receiving signal, the another phase-shift circuit is configured to shift a phase of the radio frequency receiving signal and input the phase-shifted radio frequency receiving signal into the frequency mixer, and the frequency mixer is con- figured to output a down-converted difference fre- quency signal using a local oscillator signal output by the local oscillator circuit;

wherein each of the phase-shift circuit in the radio fre- quency transmitting circuit and the another phase-shift circuit in the radio frequency receiving circuit is the phase-shift circuit according to claim 14.

19. An electronic device, comprising the radar sensor according to claim 18.

20. A calibration method for a phase shifter, applied to a calibration circuit, the phase shifter being coupled to the calibration circuit, comprising:

acquiring a radio frequency signal carrying an actual phase, wherein the radio frequency signal is output by the phase shifter;

modulating the radio frequency signal through frequency mixing with a first baseband signal to obtain a modu- lation signal carrying an actual phase;

down-converting the modulation signal to a baseband to obtain a second baseband signal carrying the actual phase; wherein the actual phase is a phase of a radio frequency signal output by the phase shifter; and the first baseband signal is an intermediate frequency sig- nal or a low frequency signal with a preset initial phase; and determining a phase deviation of the phase shifter by detecting a phase difference between a preset phase- shift phase and the actual phase carried in the second baseband signal, determining calibration phase infor- mation according to the phase deviation, generating a phase-shift control signal according to the calibration phase information, and transmitting the phase-shift control signal to the phase shifter.

* * * * *